United States Patent [19]

Lennon

[11] 4,272,720
[45] Jun. 9, 1981

[54] LIGHTNING DISCHARGE IDENTIFICATION SYSTEM

[75] Inventor: Carl L. Lennon, Merritt Island, Fla.

[73] Assignee: The United States of America as represented by the Administrator of the National Aeronautics and Space Administration, Washington, D.C.

[21] Appl. No.: 43,945

[22] Filed: May 30, 1979

[51] Int. Cl.³ .............................................. G01R 31/02
[52] U.S. Cl. ..................................... 324/72; 324/77 R
[58] Field of Search ............... 73/170 R; 324/72, 77 R

[56] References Cited

U.S. PATENT DOCUMENTS

| | | | |
|---|---|---|---|
| 3,753,117 | 8/1973 | Downing et al. | 324/72 |
| 4,100,487 | 7/1978 | Fletcher | 324/72 |
| 4,115,732 | 9/1978 | Krider | 324/72 |
| 4,198,599 | 4/1980 | Krider | 324/72 |

Primary Examiner—Michael J. Tokar

Attorney, Agent, or Firm—James O. Harrell; John R. Manning

[57] ABSTRACT

A system for differentiating between cloud-to-cloud and cloud-to-ground lightning discharges which include an electric field antenna that senses the rate of change of an electric field produced by a lightning discharge. When the signal produced by the electric field exceeds a predetermined threshold, it is fed to a coincidence detector. A VHF antenna it also provided and generates a video signal responsive to a cloud-to-cloud lightning discharge, and this signal is fed through a level sensor, an inverter, to the coincidence detector simultaneously with the signal from the field detector. When signals from the electric field antenna and the VHF antenna appear at the coincidence detector simultaneously, such indicates that there is a cloud-to-cloud lightning discharge; whereas, when there is not a signal produced on the VHF antenna simultaneously with a signal produced by the field sensor, then a strike indicator connected to the coincidence detector indicates a cloud-to-ground lightning discharge.

4 Claims, 3 Drawing Figures

LIGHTNING DISCHARGE IDENTIFICATION SYSTEM

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

Heretofore, detection devices have sensed the magnitude and polarity of electric field changes associated with lightning discharges. Previous devices have been unreliable because the polarity of electric field change is dependent upon the location of the detector as well as the type of lightning discharge. This problem can be partially overcome by the use of a large number of sensors dispensed over a large area. The use of multiple sensors is, however, expensive and requires an extensive communications and analysis system.

SUMMARY OF THE INVENTION

The invention includes a system for differentiating between cloud-to-cloud and cloud-to-ground lightning discharges. The system is based on concurrent measurements of the rate of change of the electric field produced by the lightning discharge in the 1-KHZ to the 2-MHZ frequency range and the level of radiation in the 30–50 MHZ frequency band.

It has been observed that there is a large change in the electric field gradient and minimum VHF radiation associated with the initial phase of a return strobe produced by a cloud-to-ground lightning discharge. However, in a cloud-to-cloud lightning discharge, electric field changes and RF radiation in the 30–50 MHZ frequency band are produced. By providing circuitry to detect the presence of an electric field change that is not accompanied by substantial radiation in the 30–50 MHZ range, a device constructed in accordance with the present invention detects ground strikes and distinguishes between the cloud-to-cloud and cloud-to-ground strikes.

In order to accomplish this, the system constructed in accordance with the present invention includes an electric field sensor which senses a change in the electric field responsive to a lightning discharge. This signal is fed to a level sensor which generates an output signal of a predetermined duration responsive to the electric field signal exceeding a predetermined threshold level. The output of the level sensor is, in turn, fed to a coincidence detector. A VHF antenna is provided for sensing changes of RF radiation and feeding such changes to a receiver that, in turn, is connected to the input of a level sensor. When the RF radiation signal exceeds a predetermined level, a pulse is produced that is, in turn, fed through an inverter for being inverted and to another input of the coincidence detector.

When the pulses from the electric field sensor and the VHF antenna are simultaneously fed to the coincidence detector, no output signal is produced by the coincidence detector indicating that there was a cloud-to-cloud lightning discharge. However, if only a signal is fed to the coincidence detector from the electric field sensor, then the coincidence detector produces an output to a strike indicator indicating that a cloud-to-ground lightning discharge occurred.

Accordingly, it is an object of the present invention to provide a system for differentiating between cloud-to-cloud and cloud-to-ground lightning discharges.

Another important object of the present invention is to provide a relatively simple and inexpensive circuit for differentiating between cloud-to-cloud and cloud-to-ground lightning discharges.

These and other objects and advantages of the invention will become apparent upon reference to the following specification, attendant claims, and drawing.

DESCRIPTION OF A PREFERRED EMBODIMENT

Figure 1:
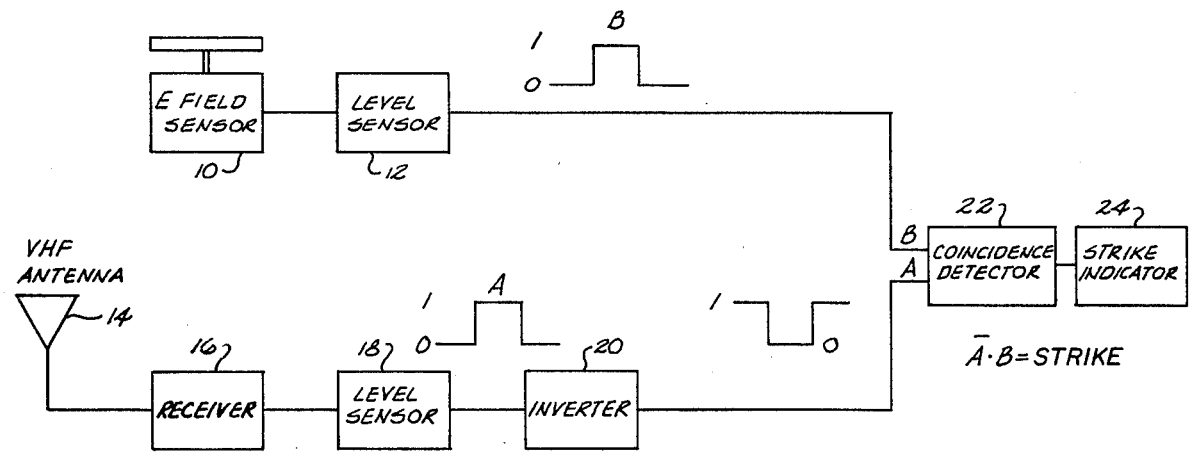
FIG. 1 is a block diagram of a system constructed in accordance with the present invention for differentiating between cloud-to-cloud and cloud-to-ground lightning discharges.

Referring to FIG. 1 of the drawing, there is illustrated an electric field sensor 10 which takes the form of an electric field antenna that senses the rate of change of an electric field produced by a lightning discharge. When the electric field change is positive and exceeds a predetermined threshold level, a level sensor 12 produces an output pulse B of approximately 2 microseconds. A VHF antenna 14 is provided for sensing changes in RF radiation that is produced by cloud-to-cloud lightning discharges. The radiation pulses impinge upon the antenna 14 and produce video pulses at the output of a receiver 16. When the level of the pulses at the output of the receiver 16 exceed a predetermined level, such cause a level sensor 18 to produce a 2 microsecond pulse A on its output that is inverted by an inverter 20.

The output pulses from the level sensor 12 and inverter 20 are fed into a pulse coincidence detector 22. The coincidence detector 22 produces an output when there is a signal B produced a positive electric field change (that exceeds the threshold level) and there are no VHF pulses A that exceed the threshold level set by level sensor 18. Connected to the output of coincidence detector is a strike indicator 24 which may be in the form of any condition responsive device such as a light, recorder, etc. to receive the signals from the coincidence detector indicating a lightning discharge.

Figure 2:
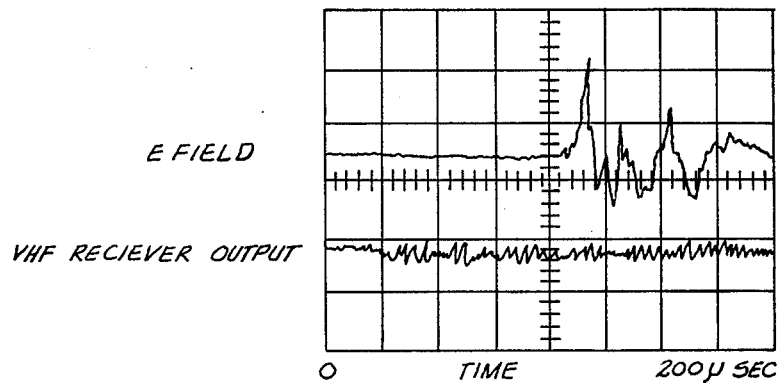
FIG. 2 is a graphic illustration of signals produced when there is a cloud-to-ground lightning discharge.

In FIG. 2, there is illustrated the type of signal that is received when there is a cloud-to-ground lightning discharge. As illustrated, there is a substantial change in the electric field that is sensed by the field sensor 10 while there is very little change in the RF radiation signal received by the VHF antenna.

Figure 3:
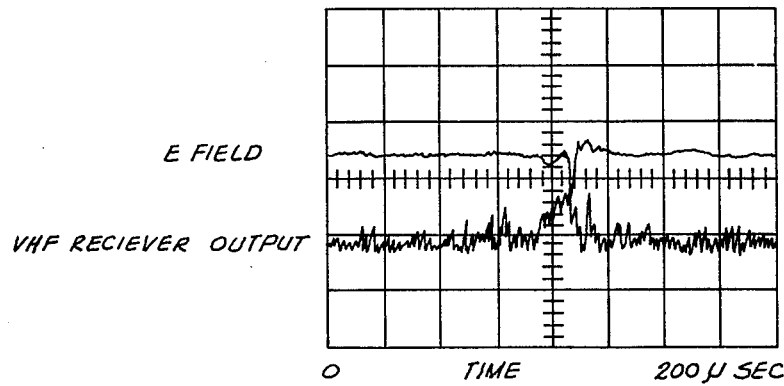
FIG. 3 is a graphic illustration of the signals that are produced when there is a cloud-to-cloud lightning discharge.

In FIG. 3, there is graphic representation of the signals produced by a cloud-to-cloud lightning discharge. When there is a cloud-to-cloud lightning discharge, the electric field changes and is sensed by the electric field sensor 10 and there is a substantial change in the RF radiation that is received by the VHF antenna. When this occurs, the signals produced by these two changes in electric field and RF radiation, respectively, cancel each other out in the coincidence detector 22 producing no signal on the strike indicator 24.

The strike indicator 24 produces an output signal when there is a cloud-to-ground discharge such as illustrated in FIG. 2.

While a preferred embodiment of the invention has been described using specific terms, such description is for illustrative purposes only, and it is to be understood that changes and variations may be made without departing from the spirit or scope of the following claims.

What is claimed is:

1. A system for differentiating between cloud-to-cloud and cloud-to-ground lightning discharges comprising:
   (a) an electric field sensing means generating an electric field signal responsive to a lightning discharge;
   (b) a level sensor means connected to said electric field sensing means generating an output signal of a predetermined duration responsive to said electric field signal exceeding a predetermined threshold level;
   (c) a coincidence detector connected to receive said output signal from said level sensor means;
   (d) a VHF sensing means generating a signal responsive to a cloud-to-cloud lightning discharge;
   (e) means connected between said VHF sensing means and said coincidence detector for supplying a signal to said coincidence detector responsive to said VHF sensing means generating a signal responsive to a cloud-to-cloud lightning discharge;
   (f) indicator means connected to said coincidence detector indicating a cloud-to-cloud lightning discharge when said coincidence detector simultaneously receives signals produced by said electric field sensing means and said VHF sensing means, and
   (g) said indicator means indicating a cloud-to-ground lightning discharge when said coincidence detector only receives a signal produced by said electric field sensing means.

2. The system as set forth in claim 1 wherein said electric field sensing means comprises:
   an electric field antenna which senses the rate of change of the electric field produced by a lightning discharge.

3. The system as set forth in claim 1 wherein said VHF sensing means comprises:
   (a) a VHF antenna, and
   (b) a receiver means connected to said VHF antenna producing video pulses responsive to a cloud-to-cloud lightning discharge.

4. The system as set forth in claim 3 wherein said means connected between said VHF sensing means and said coincidence detector comprises:
   (a) a level sensor means connected to said receiver means generating an output signal of a predetermined duration responsive to said video pulses produced by said receiver means exceeding a predetermined level, and
   (b) an inverter means connected between said level sensor means and said coincidence detector for inverting said output signal produced by said level sensor and supplying said inverted signal to said coincidence detector.

* * * * *